United States Patent
Unno et al.

[19]

[11] Patent Number: 6,076,063

[45] Date of Patent: Jun. 13, 2000

[54] AUDIO PLAYER AND RECORDER EMPLOYING SEMICONDUCTOR MEMORY AS A RECORDING MEDIUM

[75] Inventors: Yusaku Unno; Koichi Nakagawa, both of Tokyo, Japan

[73] Assignee: Oki Electric Industry Co., Ltd., Tokyo, Japan

[21] Appl. No.: 08/962,260

[22] Filed: Oct. 31, 1997

[30] Foreign Application Priority Data

Dec. 24, 1996 [JP] Japan ..................... 8-343180

[51] Int. Cl.⁷ ..................................... G06F 19/00
[52] U.S. Cl. ................. 704/500; 704/501; 704/502
[58] Field of Search ................... 704/500, 501, 704/502

[56] References Cited

U.S. PATENT DOCUMENTS

| | | | |
|---|---|---|---|
| 5,438,643 | 8/1995 | Akagiri et al. | 704/500 |
| 5,483,619 | 1/1996 | Blanchard | 704/500 |
| 5,511,000 | 4/1996 | Kaloi et al. | 704/500 |
| 5,592,588 | 1/1997 | Reekes et al. | 704/500 |
| 5,596,647 | 1/1997 | Wakai et al. | 704/500 |
| 5,787,399 | 7/1998 | Lee et al. | 704/500 |

FOREIGN PATENT DOCUMENTS

| | | |
|---|---|---|
| 0 245 531 | 11/1987 | European Pat. Off. . |
| 0299 711 | 1/1989 | European Pat. Off. . |
| 0429 092A1 | 5/1991 | European Pat. Off. . |
| 0615 349A2 | 9/1994 | European Pat. Off. . |
| 0744 752A2 | 11/1996 | European Pat. Off. . |
| 0755 056A2 | 1/1997 | European Pat. Off. . |

*Primary Examiner*—David R. Hudspeth
*Assistant Examiner*—Robert Louis Sax
*Attorney, Agent, or Firm*—Rabin & Champagne P.C.

[57] ABSTRACT

An audio recorder obtains a PCM audio signal from input analog or digital audio data, encodes the PCM audio signal, and stores the encoded signal in a semiconductor memory. The encoding method is selectable from at least two different methods, providing different levels of audio quality. The semiconductor memory may be internal to the audio recorder, or may be an external memory device such as a flash memory card. An audio player decodes the signal stored in the semiconductor memory, and converts the decoded signal to a selected one of at least two output formats.

14 Claims, 6 Drawing Sheets

ND RECORDER
AUDIO PLAYER AND RECORDER EMPLOYING SEMICONDUCTOR MEMORY AS A RECORDING MEDIUM

BACKGROUND OF THE INVENTION

The present invention relates to a recorder and player employing semiconductor memory as a medium on which an audio signal is recorded.

At present, semiconductor memory is used as a recording medium for voice signals in devices such as telephone answering machines and automobile navigation systems. The voice signals are digitized and compressed by a method such as adaptive differential pulse-code modulation (ADPCM), linear predictive coding (LPC), or code-excited linear predictive coding (CELP). These methods are substantially limited to voice signals, because they lack the frequency range and dynamic range needed for recording music signals with satisfactory quality.

Music and other quality-sensitive audio signals are generally recorded on magnetic tape or optical discs. Compact, inexpensive recorders and players employing these media are commercially available, and the compact magnetic tape cassette and compact optical disc (CD) have become standard audio media worldwide, the former for both recording and playback, the latter for playback only.

These media have a considerable cost advantage over semiconductor memory. A single CD, for example, can hold a one-hour stereo recording comprising over six hundred megabytes of audio data. Semiconductor memory with an equivalent capacity would be prohibitively expensive at present. Moreover, the quality of an audio signal reproduced from a CD is excellent.

More advanced tape and disc media have also been developed and commercialized. An early example was the digital audio tape (DAT), which enabled audio signals to be recorded on magnetic tape with CD-level quality. A more recent example is the digital compact cassette (DCC), a magnetic-tape medium developed by the Philips Corporation. Another example is the minidisc (MD) developed by the Sony Corporation, a type of magneto-optical disc which is smaller than a CD, and permits recording and erasing as well as playback.

Tape and disc media are driven by motors, however, and scanned by a magnetic or optical head. Even the most compact tape and disc recorders and players must therefore be large enough to accommodate the motor and head. If battery-driven, the motor consumes power at a rate that makes frequent battery recharging or replacement necessary. Tape and disc recorders and players moreover have moving parts that tend to wear out, and disc recorders and players, in particular, are sensitive to mechanical shock. In minidisc devices, this necessitates a large buffer memory circuit, referred to as a shock-proof memory. Overall, tape and disc devices leave much to be desired in terms of size, weight, battery life, ruggedness, and durability.

A further problem is that audio signals are recorded on tape and disc media in a variety of incompatible formats, using different encoding and compression methods. A brief summary follows.

A compact cassette stores audio signals on magnetic tape in analog form, without compression.

A CD stores audio signals in pulse-coded modulation (PCM) form, without compression, but with cross-interleave Reed-Solomon coding (CIRC) for error correction, and eight-fourteen-modulation channel encoding for accurate track-following by the optical pick-up head. The PCM sampling frequency is 44.1 kilohertz (44.1 kHz), with sixteen bits per sample.

A digital audio tape (DAT) also stores audio signals in PCM form, with a Reed-Solomon error correction code. The sampling frequency is 32 kHz, 44.1 kHz, or 48 kHz, with twelve or sixteen bits per sample.

A minidisc (MD) stores audio signals in a digital form compressed by adaptive transform acoustic coding (ATRAC), with eight-fourteen-modulation channel encoding. The sampling frequency is 44.1 kHz. ATRAC is a perceptual coding method that applies a Fourier transform to blocks of audio samples, converting each block to a frequency spectrum, then compresses each converted block according to psycho-acoustic principles. This type of compression enables the audio data to be stored at about three bits per sample without perceptible loss of quality. Since disc recording is apt to produce burst errors, an added-on cross-interleave Reed-Solomon error correction code is used.

A digital compact cassette (DCC) stores audio signals in a digital form compressed by precision adaptive subband coding (PASC). PASC resembles ATRAC in using psycho-acoustic principles, but differs in using subband analysis instead of the Fourier transform, and also differs in the compressed data rate and format. The error correction code is a $C_1$–$C_2$ Reed-Solomon code, and eight-ten modulation is adopted, for maximum recording and playback efficiency.

The Motion Picture Experts Group (MPEG) has standardized several methods of encoding digital audio signals. The different methods are identified by different layer numbers. All layers offer a selection of compression ratios; that is, the output bit rate can be varied. PASC is a version of MPEG Layer One. The higher MPEG layers are increasingly complex, but offer increasingly better sound quality for a given bit rate. The MPEG standards are currently used for audio signal transmission and broadcasting, as well as for audio recording.

In all of the above digital recording methods, the digital audio signal is accompanied by auxiliary information, referred to as a subcode or as digital management data, for example. The format and content of this auxiliary information varies from method to method.

Conventional tape and disc recorders and players are generally limited to the use of just one of these different standard coding methods and formats. As a result, many recorders and players are incompatible with many media. A further problem is that conventional audio recorders and players cannot be easily interfaced with a computer, either because of an incompatible input/output interface, or because of incompatible data formats.

SUMMARY OF THE INVENTION

It is accordingly an object of the present invention to provide a small, light-weight audio recorder and player.

A further object of the invention is to provide an audio recorder and player that are compatible with a variety of data formats and compression methods.

Another object is to provide an audio recorder and player that can be easily interfaced with a computer.

According to a first aspect of the invention, an audio recorder comprises a format converter for extracting a PCM audio signal from data recorded in any one of a variety of formats, a data compressor for encoding the extracted audio signal by a selectable one of a plurality of different methods, and a semiconductor memory for storing the resulting encoded audio signal. An audio player comprises this same semiconductor memory, a data expander for decoding the encoded audio signal stored in the semiconductor memory by a selectable one of a plurality of different methods, and a format converter for converting the decoded audio signal to a selectable one of a variety of formats.

According to a second aspect of the invention, an audio recorder comprises a format converter for extracting a PCM audio signal from data recorded in any one of a variety of formats, a data compressor for encoding the extracted audio signal according to a selectable one of a plurality of different methods, an external semiconductor memory such as a memory card of the type installable in a personal computer, and a controller for writing the encoded audio signal in the external semiconductor memory. An audio player comprises a controller for reading the audio signal from this external semiconductor memory, a data expander for decoding the encoded audio signal read from the semiconductor memory according to a selectable one of a plurality of different methods, and a format converter for converting the decoded audio signal to a selectable one of a variety of formats.

One of the plurality of encoding and decoding methods employed by the data compressor and data expander is preferably the straight PCM method, in which the data compressor and data expander transfer PCM audio data between the format converter and semiconductor memory or write controller without alteration.

Another one of the plurality of encoding and decoding methods employed by the data compressor and data expander preferably has a selectable data compression ratio.

One preferred type of semiconductor memory is flash memory, a block-erasable type of non-volatile memory. Flash memory devices used in the first aspect of the invention preferably have a data buffer with a capacity exceeding the size of a block of compressed data produced by the data compressor, and preferably have an average block transfer rate, including erase time and write time, not less than a rate at which blocks of encoded data are produced by the data compressor.

DETAILED DESCRIPTION OF THE INVENTION

Embodiments of the invention will be described with reference to the attached illustrative drawings.

Figure 1:
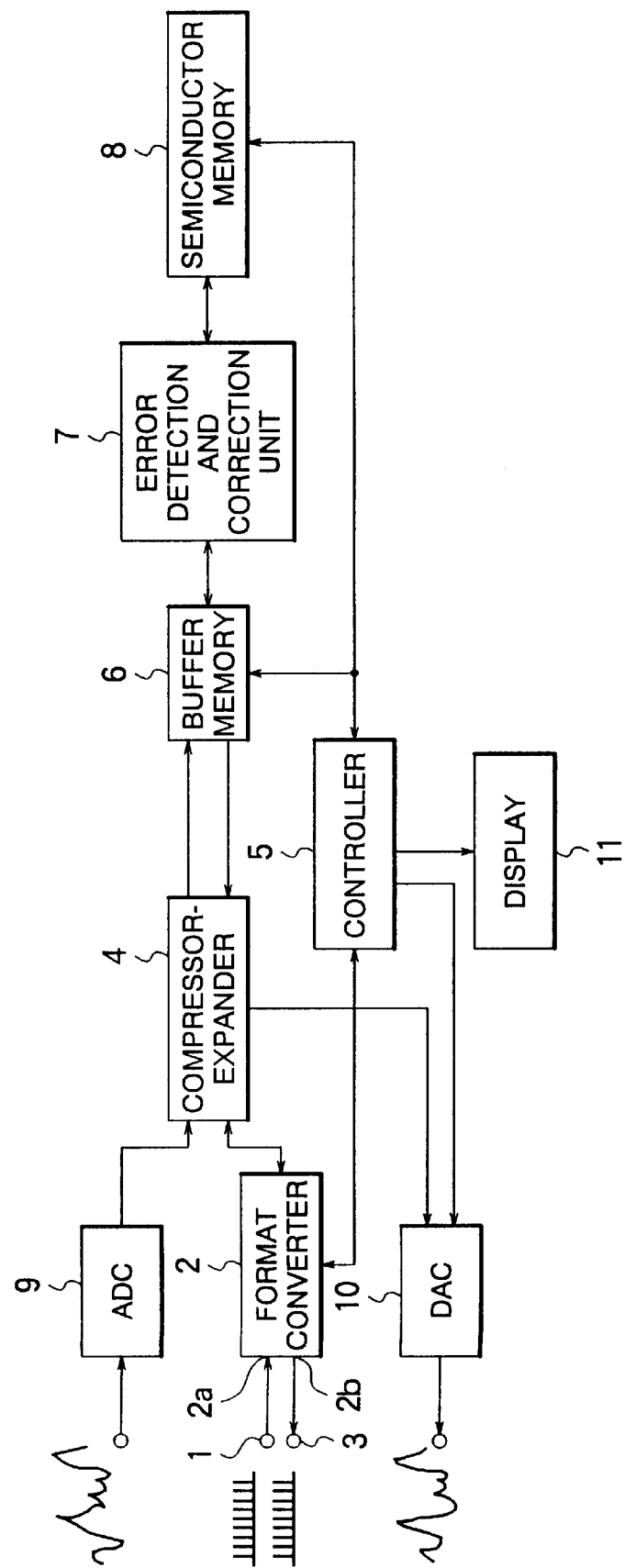
FIG. 1 is a block diagram of an audio recorder and player according to a first embodiment of the invention.

Referring to FIG. 1, the first embodiment is a combined audio recorder and player comprising a digital input terminal 1, a format converter 2, a digital output terminal 3, a data compressor-expander 4, a controller 5, a buffer memory 6, an error detection and correction unit 7, a semiconductor memory 8, an analog-to-digital converter (ADC) 9, a digital-to-analog converter (DAC) 10, and a display unit 11.

The digital input terminal 1 receives digital audio data comprising a PCM audio signal and auxiliary information. The input data may have any one of various formats employed, for example, in the prior art, with various sampling frequencies, various numbers of bits per sample, and various different types of auxiliary information.

The auxiliary information comprises, for example, a sub-code of the type used in CD and DAT recording, or another type of digital management data. Some of this auxiliary information will be necessary when the audio signal is reproduced. Two examples of such necessary information are music title information and information indicating whether the audio signal requires de-emphasis. Other information, such as information concerning the DAT track pitch, is unnecessary.

The format converter 2 has two functions. One function is a receiver function that recovers a clock signal from the audio data input at the digital input terminal 1, also extracts a PCM audio signal from the data, and furthermore extracts the necessary auxiliary information. Integrated circuits with this function are commercially available: examples include the YM3623B device manufactured by the Yamaha Corporation and the CS8412CP device manufactured by the Crystal Semiconductor Corporation. The other function is a transmitter function that adds auxiliary information to a PCM audio signal and converts the audio signal and auxiliary information to digital audio data having a selected one of the above-mentioned variety of audio formats. Integrated circuits with this functions are also available: one example is the CXD-2917Q device manufactured by the Sony Corporation.

The digital output terminal 3 outputs the digital audio signal created in this way by the format converter 2.

Figure 2:
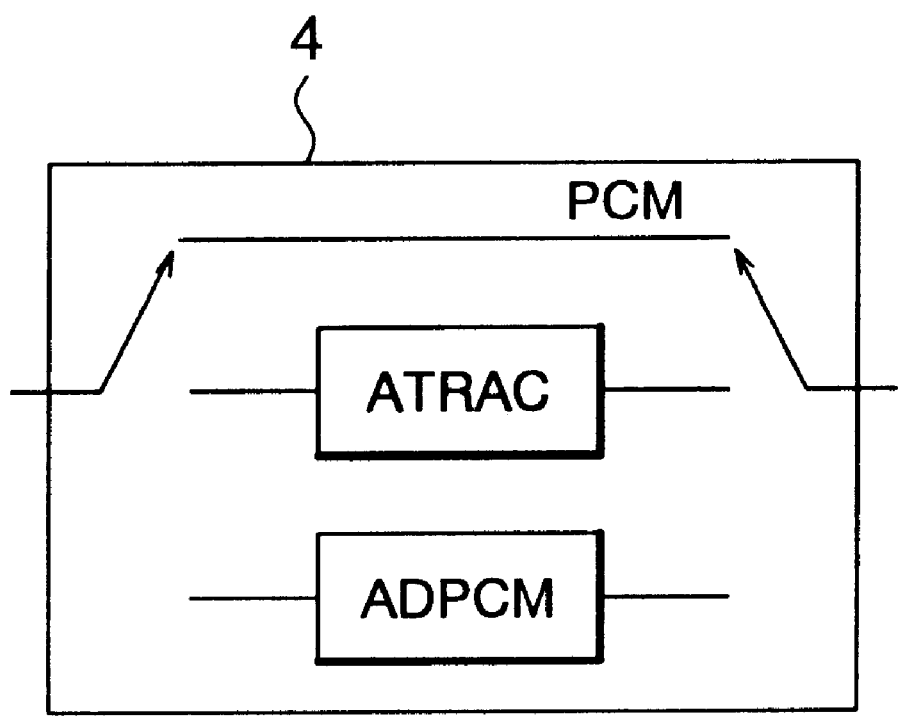
FIG. 2 is a more detailed block diagram of the data compressor-expander in FIG. 1.

The data compressor-expander 4, as shown in FIG. 2, comprises separate functional blocks for a plurality of audio encoding methods. In the present embodiment, the data compressor-expander 4 supports three methods: PCM, ATRAC, and ADPCM. The corresponding functional block in the data compressor-expander 4 is selected in response to an external command. Each functional block performs both encoding and decoding functions. The input and output of all of the functional blocks are serial data.

The ATRAC functional block comprises, for example, an integrated circuit incorporating a digital signal processor (DSP) core programmed to perform the fast Fourier transform (FFT) and other parts of the ATRAC encoding and decoding processes. Such integrated circuits are commercially available.

The ADPCM functional block comprises, for example, one or more integrated circuits that compute the difference between successive PCM sample values, and quantize these differences adaptively, the number of bits increasing when the differences become larger and decreasing when the differences becomes smaller. ADPCM is widely used in consumer products; the ADPCM functional block can be implemented with a simple circuit configuration, or in a comparatively simple monolithic integrated circuit.

The PCM functional block passes PCM audio data from the input side of the data compressor-expander 4 to the output side without performing any encoding or decoding. The PCNM functional block comprises, for example, a switching circuit that simply bypasses the other two functional blocks.

The entire data compressor-expander 4 can also be configured as a customized integrated circuit having a standard DSP core, with different program modules for carrying out PCM, ATRAC, and ADPCM processing. The TMS57070 and TMS320CX5, manufactured by Texas Instruments, are two examples of suitable DSP cores.

The controller 5 is a microcontroller programmed to control the functions of the other elements in FIG. 1, and to control the transfer of data among these elements.

The buffer memory 6 temporarily stores data received from the data compressor-expander 4, and temporarily stores data read from the semiconductor memory 8.

The error detection and correction unit 7 adds an error correction code to the data stored in the buffer memory 6, before the data are transferred to the semiconductor memory 8. The error detection and correction unit 7 also performs an error detection and correction process on data read from the semiconductor memory 8. Any of a variety of well-known error correction codes, such as Reed-Solomon codes, may be used.

The semiconductor memory 8 stores audio data as encoded by the data compressor-expander 4. The semiconductor memory 8 comprises at least one and preferably a plurality of high-capacity flash memory devices.

The analog-to-digital converter 9 converts an analog audio signal received from a microphone, cassette tape player, or other analog device (not visible) to a PCM audio signal The digital-to-analog converter 10 converts a PCM audio signal received from the data compressor-expander 4 to an analog signal, and outputs the analog signal. The digital-to-analog converter 10 preferably has a de-emphasis function, which is enabled or disabled on command from the controller 5. An example of a DAC with a de-emphasis function is the PCM1710U device manufactured by the Burr-Brown Corporation.

The display unit 11 is controlled by the controller 5, and indicates the operating status of the recorder-player.

Next, the operation of the first embodiment will be described for several cases of recording and playback.

In the first case, the ATRAC method is used to record and play back a digital stereo audio signal received from a CD player (not visible). The format converter 2 recovers a clock signal from the input signal, extracts a PCM audio signal synchronized with the clock signal, and separately extracts the subcode information needed for playback and for device control.

Figure 3A:
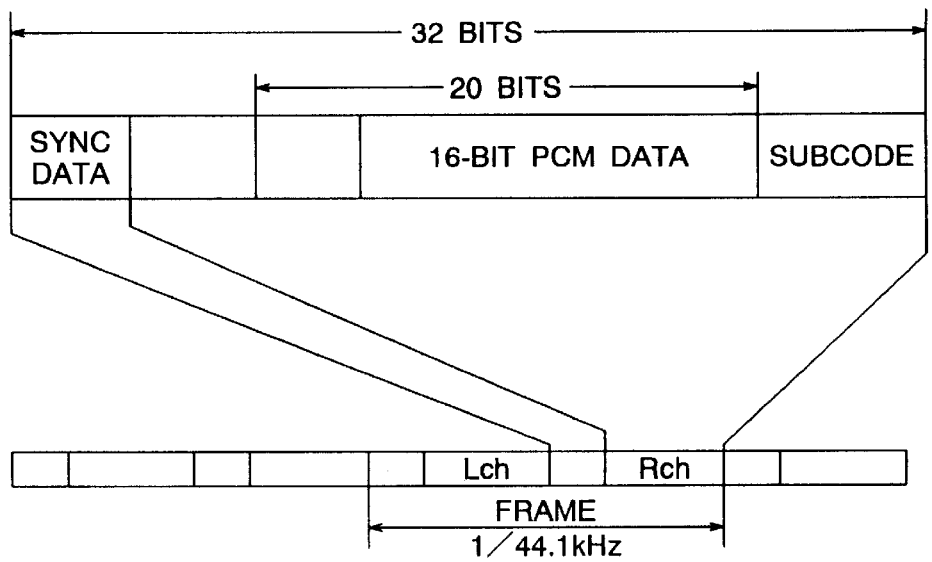
FIG. 3A illustrates the format of data received by the data compressor-expander from the format converter in FIG. 1.

FIG. 3A shows the format of the digital signal received by the format converter 2, comprising synchronization (sync) data, sixteen-bit PCM data, subcode data, and other data such as error correction code data. These data are organized into frames, each frame comprising one left-channel sample value and one right-channel sample value, the frame rate being 44.1 kHz.

Figure 3B:
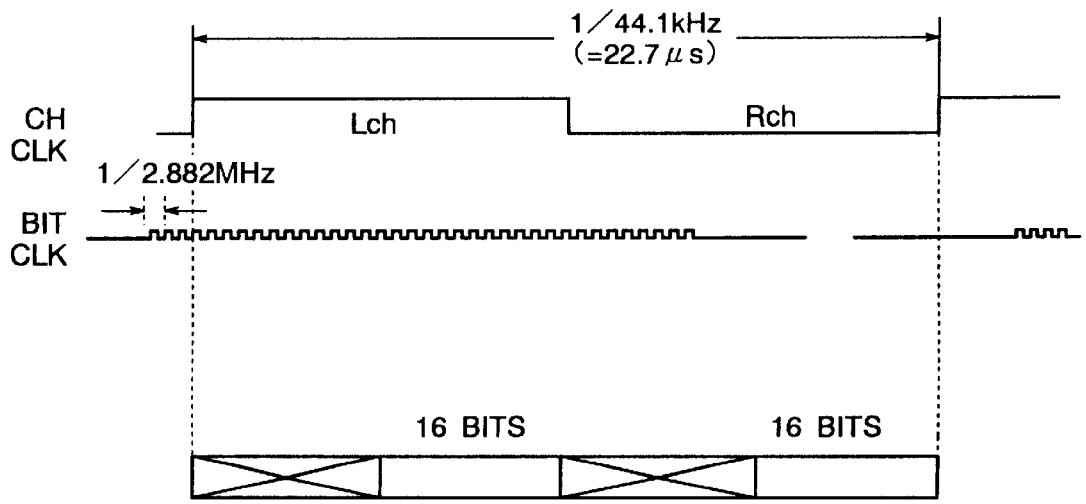
FIG. 3B illustrates the format of data sent from the data compressor-expander to the buffer memory in FIG. 1.

FIG. 3B shows the format of the PCM audio signal output by the format converter 2. Left and right channel data are identified by means of a 44.1-kHz channel clock signal (CH CLK), while the individual audio signal bits are synchronized with a bit clock signal (BIT CLK). The sample values are output in the last sixteen bit-clock periods in each half-period of the channel clock.

In the data compressor-expander 4, the ATRAC functional block processes the data received from the format converter 2 a block at a time, each block comprising five hundred twelve sixteen-bit samples (1024 bytes) per channel, representing an 11.6-millisecond segment of the audio signal. Each block is compressed to two hundred twelve bytes of data per channel, the compression ratio thus being substantially 5:1. In the compression process, frequency components that are below the human auditory threshold are discarded, and the number of bits used to encode a frequency component is reduced if the resulting quantizing noise is masked by other nearby frequency components.

Figure 4A:
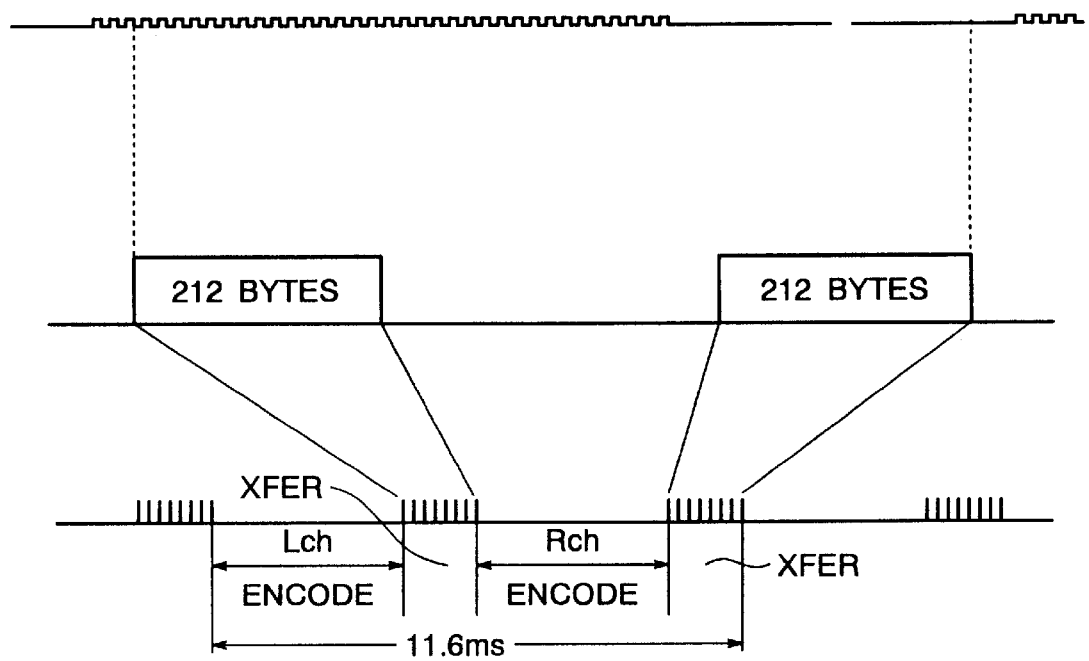
FIG. 4A illustrates the transfer of data between the data compressor-expander and buffer memory in FIG. 1.

As shown in FIG. 4A, when a block has been received, during the next 11.6 milliseconds, the left-channel (Lch) data are encoded by the ATRAC method, the encoded left-channel data are transferred (XFER) to the buffer memory 6, then the right-channel (Rch) data are encoded, and the encoded right-channel data are transferred to the buffer memory 6.

The controller 5 adds necessary auxiliary information, such as title and de-emphasis information obtained earlier from the format converter 2, and the error detection and correction unit 7 adds an error correction code. The added information and code are denoted by the letter X in FIG. 4B. The encoded audio data and added information and code X are then transferred to the semiconductor memory 8. The controller 5 also sends the semiconductor memory 8 the necessary commands and signals for storing the data, information, and code.

Since the semiconductor memory 8 employs flash memory, existing data in the memory cells must be erased before new data can be stored. Each erase operation erases a block comprising a certain number of memory cells, and takes a certain amount of time. Writing new data into the memory cells also takes a certain amount of time. These times are equal to, for example, several milliseconds at present.

Flash memory devices also have a data buffer that can hold a certain amount of data awaiting storage in the flash memory cells. Commercially available flash memories differ in the size of their data buffers. To simplify the programming of the controller 5 and avoid the need for a large buffer memory 6, it is desirable to use flash memory devices having a data buffer capacity exceeding the size of an encoded block output by the data compressor-expander 4 by a sufficient amount to allow for the addition of the auxiliary information and error correction code. In the present embodiment, a data buffer capacity of five hundred twelve bytes fulfills this condition.

The size of the data buffer in the flash memory devices does not have to be exactly equal to the size of one block of encoded audio data with associated auxiliary information and error correction code. The buffer memory 6 can absorb differences in data size.

Figure 4B:
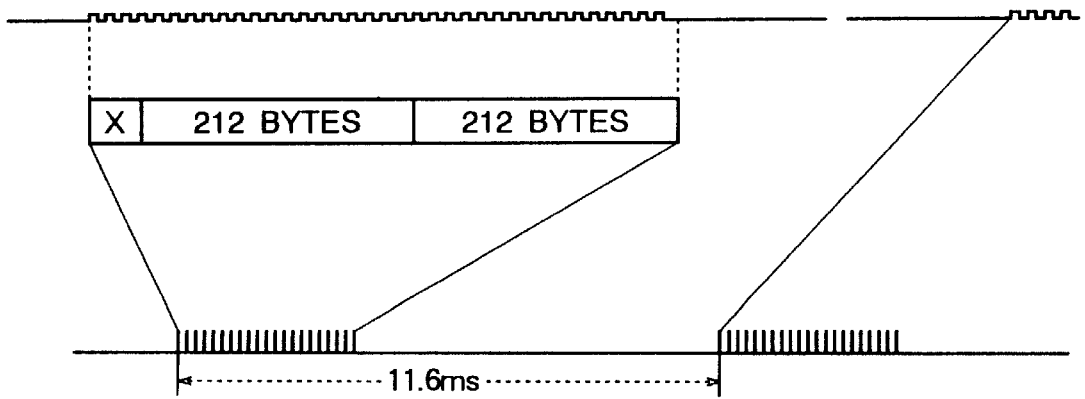
FIG. 4B illustrates the transfer of data between the buffer memory and semiconductor memory in FIG. 1.

It is of course convenient if the flash memory device can receive a block of encoded audio data, with its auxiliary information and error correction code, and store the received data in the flash memory cells quickly enough so that the time needed for receiving and storing the data does not exceed the time taken by the data compressor-expander 4 to encode and transfer one block. In FIG. 4B, this means that the flash memory must be able to receive and store five hundred twelve bytes of encoded data, with associated auxiliary information and code X, within 11.6 milliseconds.

It is even more convenient if the block erase time of the flash memory device is short enough to permit a block of flash memory cells to be erased, then filled with new data, within the aggregate time in which the data compressor-expander 4, controller 5, and error detection and correction unit 8 generate the new data. This permits the controller 5 to direct the audio data stream to one flash memory device until that device is full, then switch over to another flash memory device. A flash memory satisfying this requirement can be succinctly described as having an average block transfer rate, including erase and write times, not less than the combined rate at which data are generated by the data compressor-expander 4, data controller 5, and error detection and correction unit 7.

If the erase time is not sufficiently short, however, the controller 5 can be adapted to direct data to one flash memory device while a block in another flash memory device is being erased. It should be noted that the size of an erasable block of flash memory cells may considerably exceed the size of a block of encoded data output by the data compressor-expander 4, and the size of the flash memory's data buffer.

After having been stored in the semiconductor memory 8, the audio signal is later played back as follows.

On the basis of input from the user, the controller 5 selects the addresses in the semiconductor memory 8 from which data are to be read. The data are read and transferred to the data compressor-expander 4 a block at a time, the error detection and correction unit 7 checking for errors and correcting errors if found. The buffer memory 6 absorbs any differences between the read access rate of the semiconductor memory 8 and the rate at which data must be supplied to the data compressor-expander 4. The ATRAC functional block in the data compressor-expander 4 decodes the data, thereby expanding the data into PCM data of the type shown in FIG. 3B, with sixteen bits per sample. The controller 5 passes auxiliary information, also read from the semiconductor memory 8, to the format converter 2. The format converter 2 assembles the audio data provided by the data compressor-expander 4 and auxiliary information provided by the controller 5 into a format required by a reproducing apparatus (not visible) coupled to the digital output terminal 3, which converts the digital audio signal obtained from the digital output terminal 3 to an analog audio signal and reproduces the analog signal through a loudspeaker.

The format output by the format converter 2 during playback need not be the same as the format in which the audio signal was originally received at the digital input terminal 1. Thus a signal obtained from a CD source can be played back on apparatus originally designed for use with, for example, a minidisc, digital audio tape, or digital compact cassette.

As noted earlier, the loss of quality due to compression and expansion of the audio data is substantially imperceptible.

In the second case to be described, the input signal is an analog voice signal, which is received by the analog-to-digital converter 9 and converted to PCGN data. The ADPCM block in the data compressor-expander 4 compresses the PCM data, and transfers the compressed data to the buffer memory 6. The controller 5 adds brief auxiliary information identifying the data as ADPCM data. The ADPCM data and auxiliary information are then transferred to and stored in the semiconductor memory 8 in the same way as compressed ATRAC data, the error detection and correction unit 7 adding the same type of error correction code.

When the data are played back, the ADPCM functional block in the data compressor-expander 4 expands the compressed data read from the semiconductor memory 8 into a PCM audio signal, which the digital-to-analog converter 10 converts to an analog signal. The signal output from the digital-to-analog converter 10 can be amplified and reproduced through a loudspeaker.

In the third case to be described, an analog audio signal is recorded for subsequent copying to other digital media. In this case, the PCM functional block in the data compressor-expander 4 is selected. The PCM audio signal produced by the analog-to-digital converter 9 is transferred without compression or other alteration to the buffer memory 6 and stored in the semiconductor memory 8.

Incidentally, if the PCM audio data rate exceeds the average block transfer rate of the flash memory devices employed in the semiconductor memory 8, it is necessary for there to be at least two flash memory devices, and for the controller 5 to direct the audio data to different flash memory devices in turn.

Next, the digital output terminal 3 is connected to, for example, a digital audio tape recorder (not visible), and the stored PCM data are read from the semiconductor memory 8. The PCM functional block in the data compressor-expander 4 transfers the PCM data to the format converter 2, which formats the data as required by the digital audio tape recorder, and outputs the data at the digital output terminal 3. The digital audio tape recorder thus obtains the PCM sample values that were originally produced by the analog-to-digital converter 9, unaltered by compression and expansion, and can copy the sample values to magnetic tape without loss of audio quality.

Data can be read from a flash memory without the delays associated with erasing and writing. The data stored in the semiconductor memory 8 can therefore be transferred to the digital tape recorder at a higher speed than the transfer speed employed when the data were recorded, a feature which is convenient for rapid copying.

In the fourth case, a pre-emphasized digital audio signal is recorded by use of ATRAC compression, as in the first case described earlier, then reproduced through the digital-to-analog converter 10, as in the second case, with the controller 5 commanding the digital-to-analog converter 10 to add de-emphasis. A detailed description of these operations will be omitted, as they can be understood from the descriptions of the preceding cases.

Many other cases could be described to demonstrate the versatility of the first embodiment, which can record an audio signal from virtually any type of audio source, and provide the recorded signal to virtually any type of apparatus for reproduction or copying.

A question that arises is the maximum length of a recording in the first embodiment. This depends, of course, on the capacity of the semiconductor memory 8, but in view of the substantially 5:1 compression ratio achieved by ATRAC encoding, a semiconductor memory 8 with a capacity of sixty-eight megabytes can store a half-hour music-quality stereo recording. This capacity can currently be obtained at a reasonable cost with a modest number of flash memory devices: for example, with nine flash memory devices storing sixty-four megabits apiece.

With ADPCM compression, the recording time can be increased, making the first embodiment useful for a wide variety of voice recording applications. Moreover, the ADPCM compression ratio can be varied by adjusting the quantization parameters, enabling the user to lengthen the recording time by reducing the quality of the reproduced audio signal.

When PCM recording is used, without compression, the recording time becomes shorter, but the audio signal can be copied without degradation.

An advantage of the first embodiment is that regardless of whether and how the audio data are compressed, the process of transferring the data from the buffer memory 6 to the semiconductor memory 8 is carried out in the same way, with the same error correction code added by the error detection and correction unit 7. This is in distinct contrast to the prior art, in which audio signals are stored on different media in different formats, with different error correction codes.

Another advantage of the first embodiment is that there is no motor or other moving parts. For this reason, the first embodiment can be made smaller than conventional audio players and recorders, particularly in the thickness dimension. The first embodiment can be configured as an expansion card for installation in a computer, for example, the display unit 11 being implemented on the computer screen.

The first embodiment is also highly durable, and requires no special buffer memory for dealing with mechanical shock.

Yet another advantage of the first embodiment over recorders and players employing disc or tape media is the speed with which data can be read from the semiconductor memory 8. This speed exceeds by several orders of magnitude the speed with which data can be read from a disc or tape. This high speed is particularly useful when audio data are copied, or are transferred from the first embodiment to a computer.

Next, a second embodiment will be described.

Figure 5:
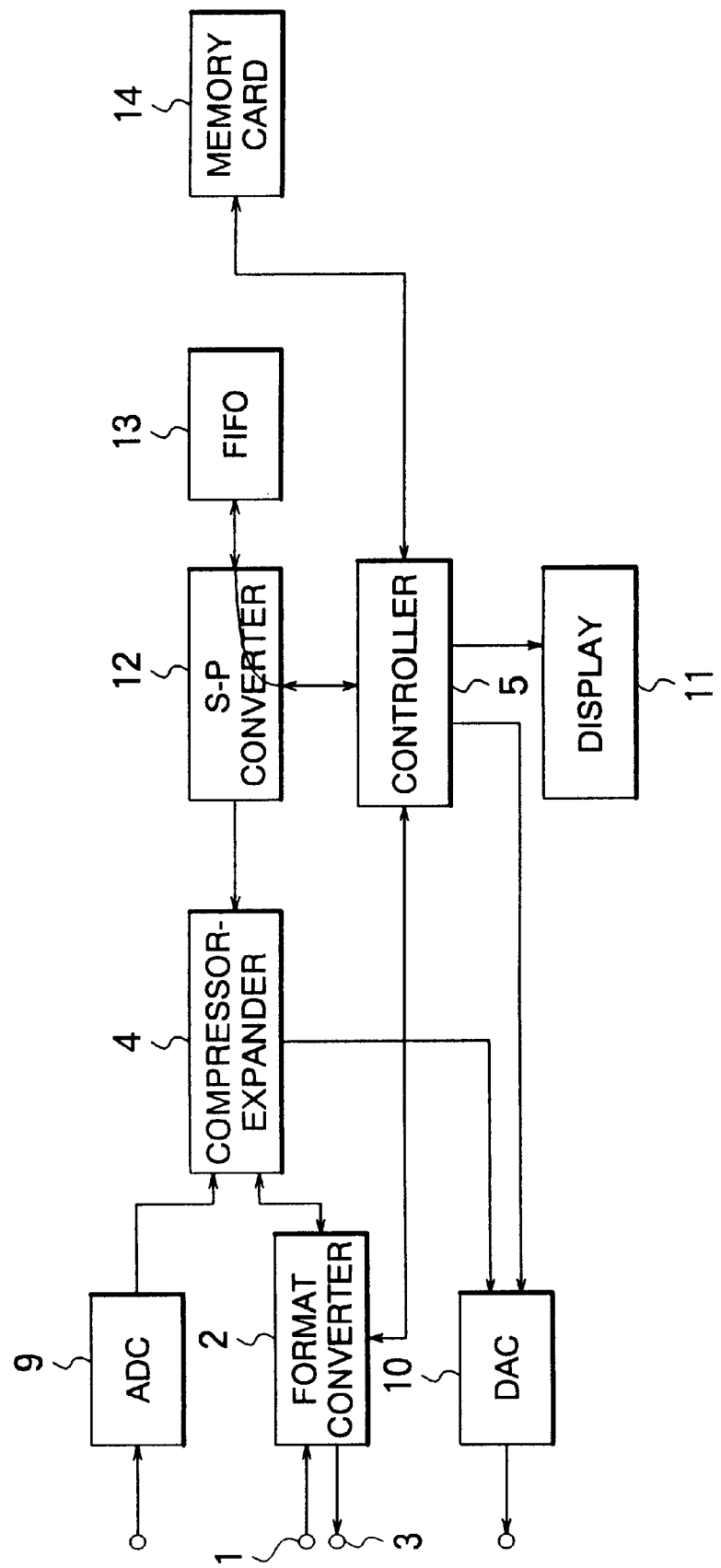
FIG. 5 is a block diagram of an audio recorder and player according to a second embodiment of the invention.

Referring to FIG. 5, the second embodiment has the same digital input terminal 1, format converter 2, digital output terminal 3, data compressor-expander 4, controller 5, analog-to-digital converter 9, digital-to-analog converter 10, and display unit 11 as the first embodiment. Detailed descriptions of these elements will be omitted. The functions of the controller 5 differ somewhat from the functions in the first embodiment; the differences will become clear below.

In place of the buffer memory 6 in the first embodiment, the second embodiment has a serial-parallel (S-P) converter 12 and a first-in-first-out (FIFO) memory 13. In place of the error detection and correction unit 7 and semiconductor memory 8 of the first embodiment, the second embodiment has a memory card 14.

Figure 6:
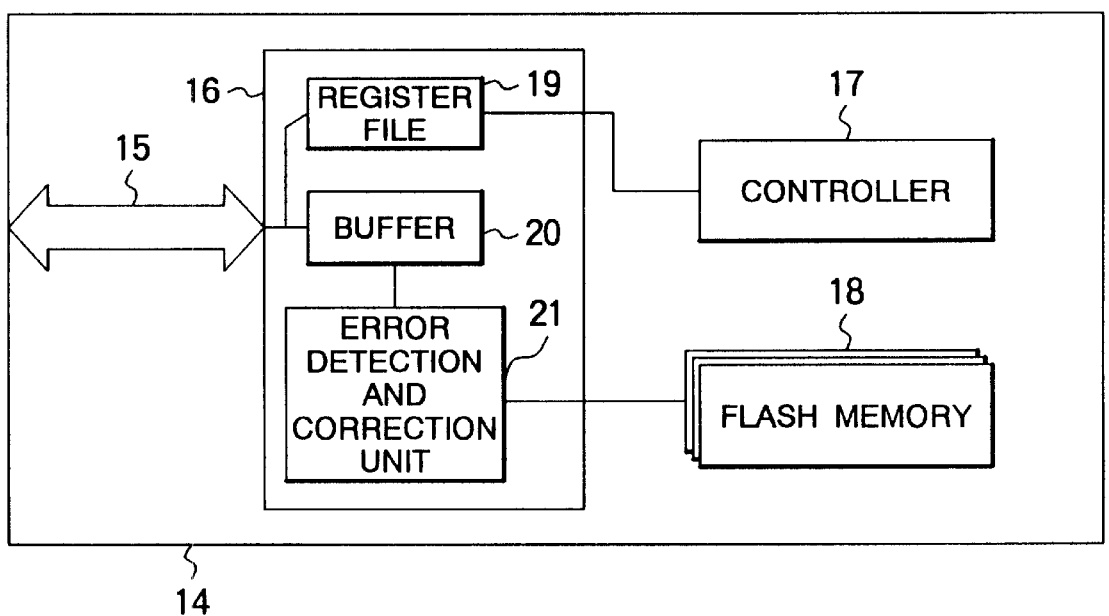
FIG. 6 is a block diagram showing the internal structure of the memory card in FIG. 5.

FIG. 6 shows the internal structure of the memory card 14, which has a data bus 15, a data controller 16, a card controller 17, and a plurality of flash memory devices 18. The data controller 16 comprises a register file 19, a buffer 20, and an error detection and correction unit 21. The data bus 15 is an interface for exchanging data with the outside world, in the present case with the controller 5. The interface specifications conform to specifications set by the Personal Computer Memory Card International Association (PCMCIA).

The memory card 14 furthermore conforms to the Advanced Technology Attachment (ATA) specification, meaning that the card's memory can be accessed in substantially the same way as a hard disk attached to a personal computer having a certain well-known industry-standard architecture. Specifically, data are transferred in eight-bit or sixteen-bit parallel form, and stored data are distributed across the flash memory devices 18 in a way that shortens the apparent write access time, as seen by the outside world.

Memory cards conforming to the above specifications, also referred to as PC-ATA memory cards, are currently available from various manufacturers.

The card controller 17 controls the overall operation of the memory card 14. The data controller 16 decodes signals received from the data bus 15 by selecting corresponding commands stored in the register file 19, decodes the selected commands, and provides the decoded commands to the card controller 17. The data controller 16 also controls the transfer of data on the data bus 15 and the reading and writing of data in the flash memory devices 18 in response to instructions from the card controller 17. The error detection and correction unit 21 detects and corrects data errors.

The register file 19 stores a variety of commands related to read-write control, address control, and other card functions. Overall, the data controller 16 enables an external device to access the flash memory devices 18 by sending simple control signals and by sending and receiving data, without having to control the flash memory read and write operations directly.

Next, the operation of the second embodiment will be described.

In recording, the data compressor-expander 4 outputs ATRAC, ADPCM, or PCM audio data in serial form to the serial-parallel converter 12, which converts the data to parallel form and stores the data in the FIFO memory 13. The controller 5 monitors the status of the FIFO memory 13. When the FIFO memory 13 contains five hundred twelve bytes of data, the controller 5 transfers these five hundred twelve bytes from the FIFO memory 13 to the memory card 14 together with a write signal, causing the data to be stored in the flash memory devices 18. When the write operation is completed, the memory card 14 sends a ready signal to the controller 5. After receiving this signal, the controller 5 sends the next five hundred twelve bytes from the FIFO memory 13.

When there is also auxiliary information to be stored, the controller 5 adds this information to the audio data stored in the FIFO memory 13, and transfers the combined audio data and auxiliary information to the memory card 14, five hundred twelve bytes at a time.

When ATRAC compression is employed, the FIFO memory 13 receives data from the serial-parallel converter 12 in bursts of two hundred twelve bytes, instead of five hundred twelve bytes. This does not cause problems, because the FIFO memory 13 can be written and read simultaneously, on a byte-by-byte basis.

In playback, whenever the FIFO memory 13 holds less than five hundred eleven bytes of data, the controller 5 transfers more data from the memory card 14 into the FIFO memory 13. Data read from the FIFO memory 13 are converted from parallel to serial form by the serial-parallel converter 12, and furnished to the data compressor-expander 4.

Other aspects of the operation of the second embodiment are the same as in the first embodiment.

In addition to the advantages provided by the first embodiment, the second embodiment provides further advantages through the use of a standard PC-ATA memory card 14, and the recording of audio data in a standard form with a standard error correction code.

One further advantage is that the user can keep audio data on a collection of memory cards, which can be mounted in the recorder-player as required. Memory cards containing pre-recorded audio data can be made commercially available in the way that audio tapes and discs are made available at present.

Another further advantage is that the memory card 14 can be removed from the second embodiment and mounted in an expansion slot in a personal computer, enabling the computer to access the stored audio data for playback or other processing. The computer can take full advantage of the high access speed of the memory card 14, and audio data can be repeatedly transferred between the computer and memory card 14 without degradation.

As one example, an audio signal can be recorded in the memory card 14 by use of the PCM functional module in the data compressor-expander 4, then the memory card 14 can removed from the player-recorder and mounted in a computer equipped with software for audio signal processing. The audio data can be read into the computer, modified by use of the software, then stored again in the memory card 14. This process can be repeated any number of times, until the desired modification is achieved, without loss of audio quality. The memory card 14 can then be returned to the player-recorder, and the modified audio signal played back as described above.

A related advantage is that audio data can easily be distributed over computer networks, stored in memory cards, then played by use of a player-recorder of the invented type.

The data compressor-expander 4 is not restricted to the ATRAC, ADPCM, and PCM functional blocks shown in the drawings. In particular, the data compressor-expander 4 may provide a selection of music-quality audio compression methods, such as a selection between ATRAC and one or more of the MPEG audio layers. A selection of compression ratios in these compression methods is also preferable, enabling the user to trade off sound quality against recording time.

A selection of voice-quality compression methods can also be provided, as well as a selection of voice-quality compression ratios.

When removable memory cards are used, it is not necessary for recording and playback functions to be provided in the same device. The recorder and player may be separate.

The embodiments described above were general-purpose audio recorder-players intended for recording and playing both voice and music, but the invention can also be practiced in more specialized equipment, as in an audio recorder-player dedicated to music-quality recording, an audio recorder-player built into a personal computer, or an audio player for repetitively playing background music.

Although the invention concerns an audio recorder and player, this does not preclude the recording of other types of data, such as image or text data, on the same semiconductor memory medium.

The semiconductor memory medium is not restricted to flash memory. Battery-backed-up dynamic random-access memory, for example, can be employed.

Those skilled in the art will recognize that further variations are possible within the scope claimed below.

What is claimed is:

1. An audio recorder, comprising:
   a format converter for extracting a PCM audio signal from digital audio data received in any one of a plurality of formats;
   a data compressor coupled to said format converter, for encoding said PCM audio signal according to a selectable one of a plurality of different methods, thereby producing encoded data;
   a semiconductor memory coupled to said data compressor, for storing said encoded data; and
   an error detection and correction unit coupled between said data compressor and said semiconductor memory, for adding an error correction code to said encoded data, said error detection and correction unit employing a single error correction code for all methods of encoding used by said data compressor.

2. The audio recorder of claim 1, wherein one of the plurality of different methods employed by said data compressor comprises transferring said PCM audio signal to said semiconductor memory as received from said format converter, without alteration.

3. The audio recorder of claim 1, wherein said format converter also extracts auxiliary information from said digital audio data, and said semiconductor memory also stores at least part of said auxiliary information.

4. The audio recorder of claim 1, wherein at least one of the methods employed by said data compressor to encode said PCM audio signal has a variable compression ratio.

5. The audio recorder of claim 1, wherein:
   one of the methods employed by said data compressor to encode said PCM audio signal divides said PCM audio signal into blocks and encodes one block at a time; and
   said semiconductor memory comprises a type of flash memory having a data buffer with a capacity exceeding one block of said encoded data.

6. The audio recorder of claim 5, wherein said flash memory has an average block transfer rate, including erase and write times, not less than a rate at which said encoded data are produced.

7. The audio recorder of claim 1, wherein said semiconductor memory is removably coupled to said data compressor.

8. The audio recorder of claim 7, wherein said semiconductor memory is disposed in a memory card conforming to standard specifications for use with a personal computer.

9. An audio player, comprising:
   a semiconductor memory for storing an encoded audio signal;
   a data expander coupled to said semiconductor memory, for decoding said encoded audio signal according to a selectable one of a plurality of different methods, thereby producing a PCM audio signal;
   a format converter coupled to said data expander, for converting said PCM audio signal to a selectable one of a plurality of formats; and
   an error detection and correction unit coupled between said data expander and said semiconductor memory, for correcting errors in the audio signal stored in said semiconductor memory, employing a single error correction code for all methods of decoding used by said data expander.

10. The audio player of claim 9, wherein said semiconductor memory is removably coupled to said data compressor.

11. The audio recorder of claim 10, wherein said external semiconductor memory is disposed in a memory card conforming to standard specifications for use with a personal computer.

12. The audio player of claim 11, wherein one of the plurality of different methods employed by said data expander comprises transferring said audio signal to said format converter as received from said semiconductor memory, without alteration, the audio signal being stored in said semiconductor memory in PCM form.

13. The audio player of claim 11, wherein at least one of the methods employed by said data expander to decode said audio signal has a variable expansion ratio.

14. The audio player of claim 11, wherein said semiconductor memory comprises flash memory.

* * * * *